United States Patent
Rae et al.

(10) Patent No.: US 9,225,340 B2
(45) Date of Patent: Dec. 29, 2015

(54) FREQUENCY REFERENCE CORRECTION FOR TEMPERATURE-FREQUENCY HYSTERESIS ERROR

(75) Inventors: Timothy Roberton Rae, Auckland (NZ); Oleg Nokhimovich Sheynin, Auckland (NZ); Brent John Robinson, Auckland (NZ)

(73) Assignee: RAKON LIMITED, Mt. Wellington, Auckland (NZ)

( * ) Notice: Subject to any disclaimer, the term of this patent is extended or adjusted under 35 U.S.C. 154(b) by 1131 days.

(21) Appl. No.: 13/131,969

(22) PCT Filed: Nov. 30, 2009

(86) PCT No.: PCT/NZ2009/000266
§ 371 (c)(1),
(2), (4) Date: Oct. 18, 2011

(87) PCT Pub. No.: WO2011/016732
PCT Pub. Date: Feb. 10, 2011

(65) Prior Publication Data
US 2012/0042192 A1    Feb. 16, 2012

Related U.S. Application Data

(60) Provisional application No. 61/118,559, filed on Nov. 28, 2008.

(51) Int. Cl.
| | |
|---|---|
| G06F 1/04 | (2006.01) |
| H03L 1/02 | (2006.01) |
| H03B 5/04 | (2006.01) |
| H03J 1/00 | (2006.01) |

(52) U.S. Cl.
CPC ........ *H03L 1/026* (2013.01); *H03B 5/04* (2013.01); *H03J 1/0008* (2013.01); *H03L 1/025* (2013.01)

(58) Field of Classification Search
CPC .......... H03L 1/026; H03L 1/025; H03B 5/04; H03J 1/0008
See application file for complete search history.

(56) References Cited

U.S. PATENT DOCUMENTS

| | | | |
|---|---|---|---|
| 5,574,408 | A | 11/1996 | Zwack |
| 5,864,315 | A * | 1/1999 | Welles et al. ............ 342/357.74 |
| 5,912,595 | A | 6/1999 | Ma et al. |
| 6,545,550 | B1 * | 4/2003 | Frerking ....................... 331/44 |
| 6,630,872 | B1 | 10/2003 | Lanoue et al. |

(Continued)

FOREIGN PATENT DOCUMENTS

WO     2006000611     1/2006

OTHER PUBLICATIONS

Bruce M. Penrod, "Adaptive Temperature Compensation of GPS Disciplined Quartz and Rubidium Oscillators," IEEE International Frequency Control Symposium, 1996, pp. 980-987.

(Continued)

*Primary Examiner* — M Elamin
(74) *Attorney, Agent, or Firm* — Dann, Dorfman, Herrell and Skillman, P.C.

(57) ABSTRACT

Disclosed and claimed is a method of improving the effective frequency stability of a frequency reference, wherein an algorithm utilizing temperature frequency hysteresis characterization values or hysteresis model parameters, and temperature history data, is used to account for effects of temperature frequency hysteresis. Devices and manufacturing systems are also claimed.

23 Claims, 7 Drawing Sheets

(56) References Cited

U.S. PATENT DOCUMENTS

| | | | |
|---|---|---|---|
| 6,662,107 B2 * | 12/2003 | Gronemeyer | 701/478 |
| 6,985,811 B2 * | 1/2006 | Gronemeyer | 701/469 |
| 7,253,767 B1 * | 8/2007 | Junkar et al. | 342/357.62 |
| 7,259,637 B1 | 8/2007 | O'Neal | |
| 7,466,209 B2 | 12/2008 | Babitch | |
| 7,649,426 B2 * | 1/2010 | Stolpman | 331/176 |
| 7,865,307 B2 * | 1/2011 | Gronemeyer | 701/478 |
| 8,159,392 B2 * | 4/2012 | Jin et al. | 342/357.63 |
| 8,249,616 B2 * | 8/2012 | Boejer et al. | 455/456.1 |
| 2002/0005765 A1 * | 1/2002 | Ashley et al. | 331/176 |
| 2003/0176204 A1 * | 9/2003 | Abraham | 455/556.1 |
| 2005/0146244 A1 | 7/2005 | Gunawardana | |
| 2006/0094465 A1 * | 5/2006 | Abraham | 455/556.1 |
| 2007/0092035 A1 * | 4/2007 | Kim | 375/296 |
| 2008/0039116 A1 * | 2/2008 | Abraham | 455/456.1 |

OTHER PUBLICATIONS

Extended European Search Report, Appln. No. 09848104.7, Mar. 18, 2014, pp. 1-5.

* cited by examiner

```
currentTemp=ADC_REGISTER_VALUE;
previousTemp=maxima(tableSize+1);
numErased=0;
M0=previousTemp;
m0=currentTemp;

if currentTemp > previousTemp
// if input has increased simply remove any wiped out vertices
    for k from 1 to tableSize
        if currentTemp > maxima(k) || currentTemp < minima(k)
            numErased=numErased+1;
            maxima(k)=0;
            minima(k)=0;
        end if
    end for
    tableSize=tableSize-numErased;
elseif currentTemp < previousTemp
// remove wiped vertices & use lowest wiped maxima in new vertex
    for k from 1 to tableSize
        if currentTemp > maxima(k) || currentTemp < minima(k)
            numErased=numErased+1;
            if numErased==1
             M0=maxima(k);
            end
            // pad wiped out vertices with zeros
            maxima(k)=0;
            minima(k)=0;
        end if
    end for
    // add a new vertex to replace wiped out vertex or vertices
    tableSize=tableSize-numErased+1;
    maxima(tableSize)=M0;
    minima(tableSize)=m0;
end if maxima(tableSize+1)=currentTemp;
```

Figure 4

```
coeffH=HYSTERESIS_COEFFICENTS_MEMORY_BLOCK;
coeffL=LINEAR_COEFFICIENTS_MEMORY_BLOCK;
Mk=MAXIMA_MEMORY_BLOCK;
mk=MINIMA_MEMORY_BLOCK;
tableSize=TABLE_SIZE_REGISTER_VALUE;
currentTemp=Mk(tableSize+1);
polyOrderH=5;
polyOrderL=5;

outInc=0;
for k from 1 to tableSize
    n=1;
    for l from 0 to polyOrderH
        for m from 0 to polyOrderH-1
            tn=coeff(n)*(mk(k)^l*(Mk(k+1)^m-Mk(k)^m));
            outInc=outInc + tn;
            n=n+1;
        end for
    end for
end for majorLoop=0;
for i from 0 to polyOrderL
majorLoop=majorLoop + coeffL(i)*currentTemp^i;
end for FREQUENCY_CORRECTION_REGISTER=majorLoop + outInc;
```

Figure 5

FREQUENCY REFERENCE CORRECTION FOR TEMPERATURE-FREQUENCY HYSTERESIS ERROR

CROSS REFERENCE TO RELATED APPLICATION

This application claims the benefit of U.S. Provisional Application No. 61/118,559, filed Nov. 8, 2008.

FIELD OF INVENTION

The invention relates to improving frequency stability in frequency reference devices used, for example, in contemporary communication and navigation systems.

BACKGROUND OF THE INVENTION

Thermal hysteresis has been a significant contributing factor to frequency instability of RF oscillators and in particular, quartz crystal oscillators (XO) which are currently the most widely used frequency reference technology for high-performance consumer applications, such as mobile phones and GPS receivers, due to the corresponding high performance-to-cost ratio.

Current technology used to achieve maximum frequency stability in XO uses interpolation of a lookup table of frequency and temperature measurements to minimise temperature induced frequency error. However, this approach cannot remove the effects of hysteresis and is typically limited to about ±0.25 ppm stability over a temperature range of −30° C. to +80° C.

U.S. Pat. Nos. 7,259,637 and 7,466,209 disclose systems which attempt to model thermal hysteresis in XO by offering two possible frequency versus temperature curves for each of the two directions of temperature. U.S. Pat. No. 7,259,637 discloses a system in which a separate lookup-table of temperature versus frequency values is used for when the temperature is increasing to when the temperature decreasing. U.S. Pat. No. 7,466,209 discloses a system which aims to account for temperature versus frequency directional dependence by providing a single function that models a frequency curve for when the temperature is increasing and another frequency curve for when the temperature is decreasing.

As consumer expectations become increasingly demanding, the frequency stability requirements become progressively more stringent. For example, as GPS technology has become more and more widespread—so has the consumer expectation of using a GPS receiver indoors. This typically requires operating the receiver in weak signal conditions which can be in the order of −165 dBm, pushing the limits of the current state of the art.

One method of improving receiver performance is increasing the integration periods in the code correlation. However, this has the consequence that the tolerance of the receiver to frequency reference instabilities is dramatically reduced through a square law relationship. Thus, if the contribution of hysteresis to these instabilities can be mitigated then it will allow GPS receivers to take advantage of longer integration times, therefore offering improved sensitivity without significantly increasing core processing power.

SUMMARY OF THE INVENTION

In broad terms in one aspect the invention provides a method of improving the effective frequency stability of a frequency reference device, wherein an algorithm utilizing a set of mathematical parameters determined from frequency and temperature sensing measurements of the device over a number of temperature excursions of different magnitudes is used in conjunction with temperature measurement history to account for effects of hysteresis in the said device's frequency-temperature characteristic.

In broad terms in another aspect the invention provides a method of improving the frequency stability of a frequency reference, or improving the effective frequency stability of a frequency reference in a host application system, comprising:
  a) retrieving from memory hysteresis characterization values or model parameters derived from frequency and temperature sensing data, said data relating to multiple temperature excursion dependent hysteresis branches of either the reference frequency with respect to temperature, or the frequency of a reference device having sufficiently similar frequency vs. temperature hysteresis behavior,
  b) retrieving from memory at least one hysteretic state parameter, representative of the accumulated hysteretic effect of the prior temperature history, and continually or periodically storing updated values of said hysteretic state parameter(s),
  c) executing in an integrated circuit an error calculation algorithm arranged to calculate an estimate of any reference frequency error using said hysteresis characterization values or model parameters, and said hysteretic state parameter(s), and
  d) using said estimate of frequency error to correct the reference frequency, or to mitigate the effect of any reference frequency error in the host application system.

In broad terms in a further aspect the invention provides a frequency reference source or a host application system comprising:
  a) memory storing hysteresis characterization values or model parameters derived from frequency and temperature sensing data, said data relating to multiple temperature excursion dependent hysteresis branches of either the reference frequency with respect to temperature, or the frequency of a reference device having sufficiently similar frequency vs. temperature hysteresis behavior,
  b) memory storing at least one hysteretic state parameter, representative of the accumulated hysteretic effect of the prior temperature history, and continually or periodically storing updated values of said hysteretic state parameter(s),
  c) an integrated circuit executing an error calculation algorithm arranged to calculate an estimate of any reference frequency error using said hysteresis characterization values or model parameters, and said hysteretic state parameter(s),
  d) the frequency reference source being arranged to use said estimate of frequency error to correct the reference frequency, or to use said estimate of frequency error to mitigate the effect of any reference frequency error in the host application system.

The invention enables frequency references with improved frequency stability by providing a method to calculate an estimate of the thermal hysteresis induced frequency error; this frequency error can then be fed-forward to a frequency synthesizer in the host application (for example a spread-spectrum radio receiver such as a GPS receiver) or fed-back to a tuning input in the frequency reference.

In broad terms in a further aspect the invention comprises a method of manufacturing a frequency reference device which includes subjecting the device to frequency and temperature sensing measurements over a number of temperature excursions of different magnitudes to determine a set of mathematical parameters for use in conjunction with temperature measurement history to account for effects of hysteresis in the said device's frequency-temperature characteristic.

In some embodiments the invention comprises a frequency reference in close thermal contact with a temperature sensor, a block of memory which stores hysteresis characterization values or hysteresis model parameters and history data, an algorithm which determines and adaptively updates the historical temperature reversal points of interest, and a frequency prediction algorithm which takes the hysteresis characterization values or hysteresis model parameters and history data and calculates the effect of each of the temperature history reversal points on the frequency error and sums them up to provide an estimate of the total frequency error.

In this specification and claims, unless the context indicates otherwise, the term "frequency reference device" means a device providing an electrical signal of a stable frequency; the term "frequency reference" means the stable frequency signal provided by such a device, however it can sometimes be used to mean the frequency reference device, the meaning being clear from the context; and the term "reference frequency" means the frequency of the reference signal.

The term "comprising" as used in this specification means "consisting at least in part of". When interpreting each statement in this specification that includes the term "comprising", features other than that or those prefaced by the term may also be present. Related terms such as "comprise" and "comprises" are to be interpreted in the same manner.

BRIEF DESCRIPTION OF THE DRAWINGS

Preferred embodiments of the invention will be described by way of example only and with reference to the drawings, in which:

FIG. 4 is the pseudo-code for the history update algorithm of the first embodiment of the invention, FIG. 5 is the pseudo-code for the frequency prediction algorithm of the first embodiment of the invention.

DESCRIPTION OF THE PREFERRED EMBODIMENT(S)

Figure 1:
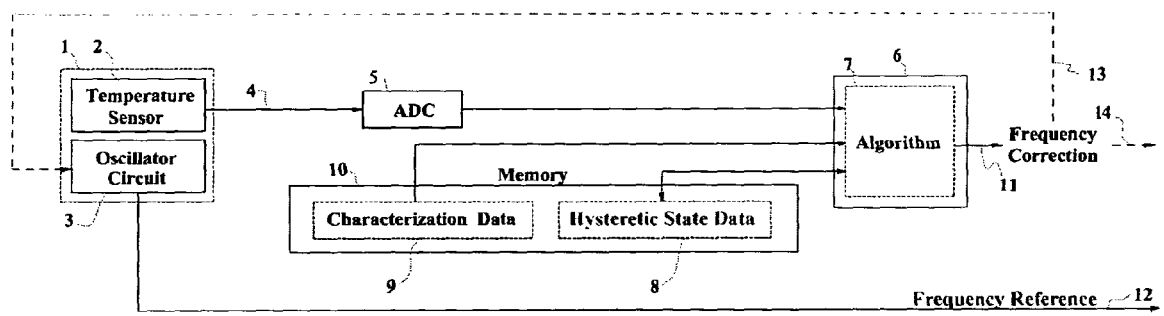
FIG. 1 is a functional block diagram of a first embodiment of the invention.

FIG. 1 is a functional block diagram showing the main parts of a typical embodiment of the invention. The system comprises an oscillator 3 in close thermal contact 1 with a temperature sensor 2, where the oscillator provides a frequency reference signal 12 to the host application system. Hysteresis characterization data 9 and hysteretic state data 8 are retrieved from memory 10 and used together with the digitized 5 temperature sensor voltage 4 by an algorithm 7 executed in an integrated circuit 6. The algorithm uses the temperature sensor measurements and hysteresis characterization and state data to calculate an estimate of the error 11 in the reference frequency.

The error estimate can be used to directly improve the stability of the reference frequency by applying a correction signal 13 to the oscillator. Alternatively, the error signal can be sent to the host application system as in 14, where it can be used to mitigate the effect of the frequency error by, for example tuning an onboard frequency synthesizer according to the error estimate. The double arrow between 7 and 8 indicates that the algorithm uses the state data for the error calculation, and also updates the state data as the hysteretic state of the reference frequency changes.

Figure 2:
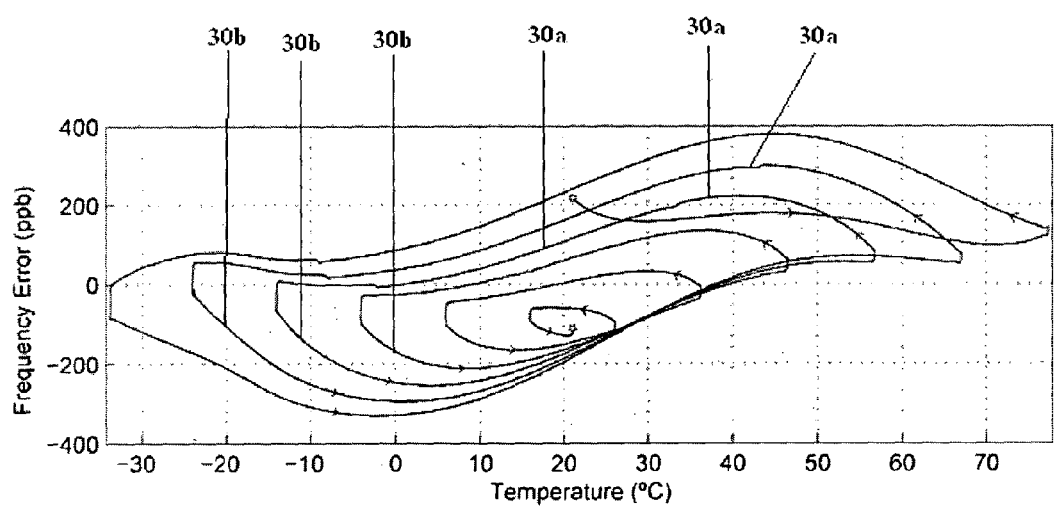
FIG. 2 is a diagram demonstrating the nature of temperature excursion dependent hysteresis.

FIG. 2 illustrates the nature of the temperature excursion dependent hysteresis for an oscillator using a quartz crystal resonator. The frequency-temperature curve starts from the point (22, 210) marked with a circle, changes between a number of extreme values, and finishes at the point (22, −100) marked with a star. An arrow indicates the direction of temperature change for each of the branches 30a and 30b on the plot (not all are referenced). It is clear that a new branch 30a or 30b is created each time the temperature changes direction, with branches 30a being associated with a decrease in temperature and branches 30b with an increase in temperature. The frequency at any given temperature can therefore take on many possible values depending on the accumulated effect of the temperature history. For example, there are 12 different frequencies corresponding to the 20° C. temperature point in FIG. 2.

Important features of the invention are the use of hysteresis characterization data built from frequency and temperature measurements covering multiple branches of the hysteresis behaviour, and the use of hysteretic state parameters to essentially determine which branch the frequency is moving along. These can then be used by an algorithm implementing a hysteresis model to calculate an estimate of the hysteresis induced frequency error.

The two main embodiments described below are both based on the above structure, however the algorithms implement different model structures with the consequence that the characterization data, and hysteretic state parameters take on different forms. This will be explained in more detail in the sections below.

First Embodiment

Figure 3:
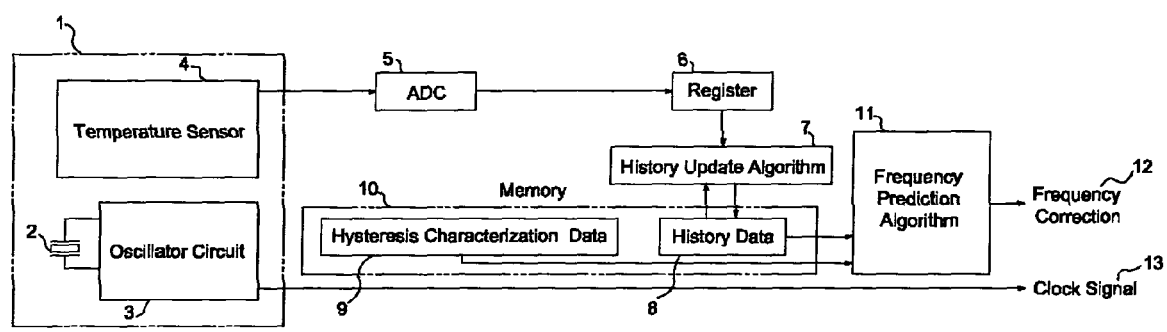
FIG. 3 is a functional block diagram of a second embodiment of the invention.

FIG. 3 is a functional diagram of a first embodiment of a generic system. The system comprises a quartz crystal 2 connected to an oscillator circuit 3 and a temperature sensor 4 which are thermally coupled 1 due to their close proximity. The temperature sensor voltage is digitized by an analog to digital converter 5 and the digital value is stored in a register 6. A history update algorithm 7 reads the temperature sensor register contents and accesses a table of temperature history values 8 from memory 10 and subsequently updates the table and stores them back in memory. A frequency prediction algorithm 11 then reads some hysteresis characterization values or parameters 9 from memory 10 in combination with the updated history data 8 and calculates a prediction of the frequency error 12.

In the functional diagram, reference to the physical location of the blocks is avoided in order to more clearly illustrate the concept of the invention. In one embodiment elements 1-4 may be integrated into a single oscillator package and elements 5-12 may reside in the host application. Other configurations are possible and are discussed in more detail subsequently.

In this current embodiment, the oscillator is provided with hysteresis characterization values or parameters 9 from the oscillator manufacturer; typically unique for every oscillator sample. The characterization values or parameters may be generated from frequency and temperature measurements of the oscillator sample while it is subjected to a specific temperature profile using a temperature control system as will be further described. This may be done prior to installation of the frequency reference device in the frequency reference source or host application system.

In a preferred embodiment the temperature profile used is referred to as the set of "first order reversal curves" (FORC) in accordance with the scientific literature on ferromagnetic hysteresis. The FORC profile (NTC temperature sensor voltages for exemplary profile shown in FIG. 6) starts at slightly above the maximum specified operating temperature $T_0$ of the oscillator. The temperature is then reduced by a small amount to a reversal point $T_{\alpha 1}$ and increased back to $T_0$. Subsequently, the temperature is again decreased to a new reversal point $T_{\alpha 2} < T_{\alpha 1}$ and again increased back up to $T_0$. This process is continued as the temperature is incrementally reduced to turning points $T_{\alpha n} < T_{\alpha (n-1)}$ and increased back up to $T_0$ until the final orbit where $T_{\alpha n}$ is at or below the specified minimum operating temperature of the oscillator. The temperature is increased to $T_0$ once more to complete the test. The temperature-frequency hysteresis characterization values or parameters can then be determined after subjecting the frequency reference device to such multiple temperature excursions of differing magnitudes.

Characterization Algorithm

When the FORC measurements are completed, the data is partitioned into the individual reversal curves which are defined as the increasing segments between the reversal points $T_{\alpha n}$ and $T_0$. For each of the n reversal curves are defined the temperature sensor voltages and frequencies at the temperature reversal points $T_{\alpha n}$ as $\alpha_n$ and $f_n(\alpha_n)$ respectively. The temperature sensor voltages as the temperature increases from $T_{\alpha n}$ to $T_0$ are then denoted as $\beta_{ni}$ and the corresponding frequencies are denoted $f_n(\beta_{ni})$.

Figure 6:
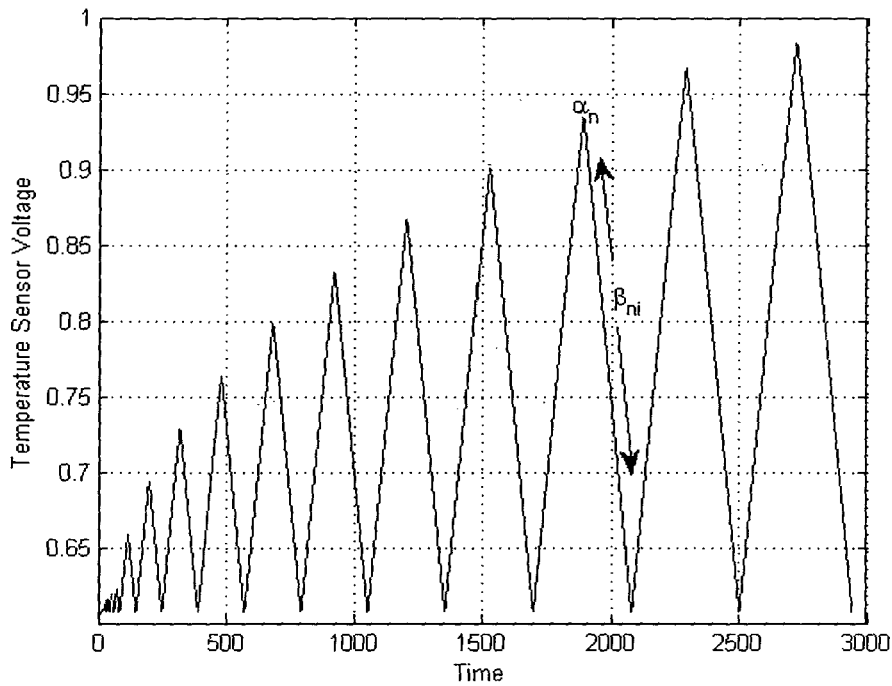
FIG. 6 is a plot of the temperature sensor voltage vs. time used for characterization in the second embodiment of the invention.
Figure 7:
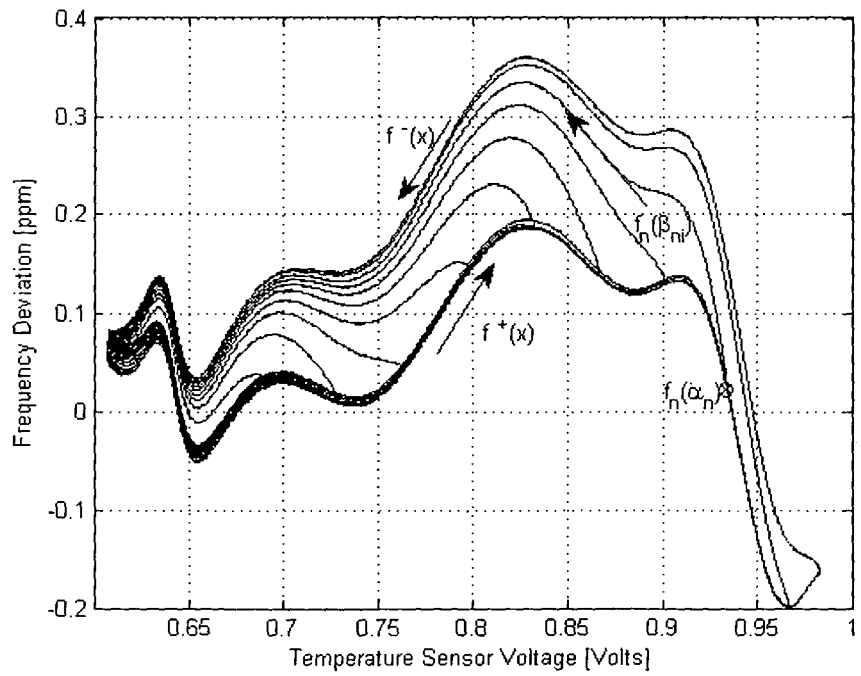
FIG. 7 is a plot of the measured frequency data vs. temperature sensor voltage used for characterization in the first embodiment of the invention.

FIG. 6 and FIG. 7 show typical plots of the temperature sensor voltage (which is inversely proportional to temperature) and the device frequency deviation respectively with $\alpha_n$, $\beta_{ni}$, $f_n(\alpha_n)$, and $f_n(\beta_{ni})$ clearly marked on one of the reversal curves (i.e. one of the branches). The ascending and descending sections of the outer loop (or "major loop") are also shown on the reversal curves of FIG. 7 as $f^+(x)$ and $f^-(x)$ respectively. Using the above notation, the characterization algorithm can then be broken down into the following steps:

Step One:
Fit a function to the outer loop ascending and descending sections $f^+(x)$ and $f^-(x)$ such as a polynomial, spline, or lookup table. Here a $9^{th}$ order polynomial is used for simplicity.

$$f^+(x) = \sum_{i=0}^{9} a_i x^i \quad (1)$$

Step Two:

Starting from the reversal curve associated with the first reversal point $\alpha_1$, build a three column table with a repeated value of $\alpha_1$, the temperature sensor voltages $\beta_{1i}$ and the output increment $\Delta$ between the measured frequency at $\beta_{1i}$ and the interpolated value of the descending section of the major loop (i.e. $\Delta_{1i} = f(\beta_{1i}) - f_1(\beta_{1i})$).

Step Three:
Repeat step two for each of the n reversal curves and concatenate each of the tables into a single table of $\alpha$, $\beta$, and $\Delta$ values.

Step Four:
Fit a 2 dimensional function to the table to get the output increment versus $\alpha$ and $\beta$. In the present embodiment we use a polynomial function of the form $$\Delta(\alpha, \beta) = \sum_{i=0}^{5} \sum_{j=0}^{5-i} c_{ij} \alpha^i \beta^j \quad (2)$$

This can be solved using standard least-squares techniques such as QR decomposition. Alternative embodiments may use different methods to represent the function, for example the values of $\Delta(\alpha, \beta)$ could be stored in memory and interpolated, alternatively universal approximators based on fuzzy logic and/or neural networks could also be used.

History Update Algorithm

The history data block 8 in FIG. 3 comprises a table of pairs of dominant maxima and minima from the accumulated temperature history of the oscillator which together represent the hysteretic state of the frequency. The history update algorithm 7 continually or periodically evaluates exactly which pairs of maxima/minima are dominant and updates the table according to new temperature measurements.

The criterion for choosing which table entries to keep or discard is based on the "wiping out" property of the Preisach Model. The wiping out property means that only an alternating series of dominant maxima and minima are stored in the history. Whenever the temperature sensor voltage increases above a stored maxima or decreases below a stored minima then that maxima/minima is no longer dominant and is deleted from the history table.

Pseudo-code for the history update algorithm 7 is shown in FIG. 4. The algorithm essentially reads the temperature sensor voltage from the ADC register and compares it with the previous sensor value which is stored in the row following the end of the table. If the reading has increased then the algorithm removes (i.e. sets to zero) any wiped out pairs of maxima/minima ("vertices"). If the sensor reading has decreased then any wiped out vertices are removed as in the increasing case and the current sensor value is merged with the first wiped-out maxima to create a new vertex. If there were no wiped-out maxima then the previous input value is used in the new vertex instead.

Frequency Prediction Algorithm

The frequency prediction algorithm 11 of FIG. 3 takes the updated history table 8 and the hysteresis characterization data 9 and calculates the expected error in the frequency of the oscillator. Pseudo-code for the algorithm is shown in FIG. 5.

The pseudo-code describes the evaluation of the following function for the "Moving Preisach" model [1], after loading all the appropriate parameters/characterization data from memory.

$$f(t) = \sum_{k=1}^{n(t)} [\Delta(M_{k+1}, m_k) - \Delta(M_k, m_k)] + f^+(u(t)) \quad (3)$$

where f$^+$ and come from equations 1 & 2 respectively and u(t) is the temperature sensor voltage.

Equation 3 essentially sums up the individual contribution of each pair of maxima and minima in the updated history table to the output increment and adds it to the ascending section of the major loop.

Frequency Correction Method

The output of the frequency prediction algorithm gives an estimate of the error in the frequency reference. This information can be used in a number of ways to correct for the device's frequency error and improve the performance of the host application system.

The preferred method of correcting for the frequency error is to use the error estimate to digitally tune a frequency synthesizer in the host application system such as a Numerically Controlled Oscillator (NCO) or a Phase Locked Loop (PLL). This is particularly pertinent in spread-spectrum radio receivers which perform the correction through software after the main mixing process is complete, without having a significant impact on the performance. A GPS receiver is an example of a system which suits such an approach.

Another method of correcting for the frequency error is to physically tune the frequency reference. This is possible in tunable devices (for example, in a quartz crystal oscillator which can be tuned with a variable capacitance via a control voltage) as well as devices which already have an operating onboard microprocessor (e.g. a Microcontroller Compensated Crystal Oscillator), in which case the hysteresis compensation method can be autonomously implemented in the frequency reference device itself, provided there is enough memory, processor power, sufficiently high resolution ADC and DAC as well as good isolation of the oscillator circuitry from any electrical noise induced by the microcontroller.

Second Embodiment

In a second embodiment, the hysteretic state can be maintained by keeping track of the most recent estimate of the reference frequency and the corresponding temperature sensor reading. This embodiment evaluates a model which gives an estimate of any frequency error using the last known hysteretic state and the current temperature. The behavior of the frequency can be represented by a differential equation such as the following:

$$\frac{df}{du} = \begin{cases} F_1(u, f), & \frac{du}{dt} > 0 \\ F_2(u, f), & \frac{du}{dt} < 0 \end{cases} \quad (4)$$

where $F_1(u, f)$ and $F_2(u, f)$ are functions of the temperature sensor and frequency (u, and f). In this case, the frequency vs. temperature behavior is described by a separate set of curves for each of the two directions of temperature sensor change, such that each point (u, f) is unique for a given direction of u.

The functions $F_1(u, f)$ and $F_2(u, f)$ are directly related to the frequency vs. temperature slope for the two possible directions of temperature change. These functions can be represented by 2D lookup tables, polynomials, splines, fuzzy logic models, neural networks, etc. as in the characterization function in the previous embodiment. The parameters or values used to characterize these functions can then be solved for from frequency vs. temperature sensor measurements over different values of (u, f)—i.e. from temperature excursions of different magnitudes, as in the previous embodiment.

As an example, the temperature profile used for the previous embodiment given in FIG. 6 can be used to find the function $F_2(u, f)$. To do this, the frequency and temperature sensor measurements of the decreasing branches of FIG. 7 are partitioned in the same way as the previous embodiment, so that a 2D polynomial function with parameters $b_{ij}$ can be fitted to the measurement data:

$$f_2(u, f) = \sum_{i=0}^{5} \sum_{j=0}^{5-i} b_{ij} u^i f^j \quad (5)$$

Once the characterization parameters $b_{ij}$ have been found is then determined by simply taking the derivative of $f_2(u, f)$ with respect to the temperature sensor giving:

$$F_2(u, f) = \sum_{i=0}^{5} \sum_{j=0}^{5-i} i b_{ij} u^{i-1} f^j \quad (6)$$

Figure 8:
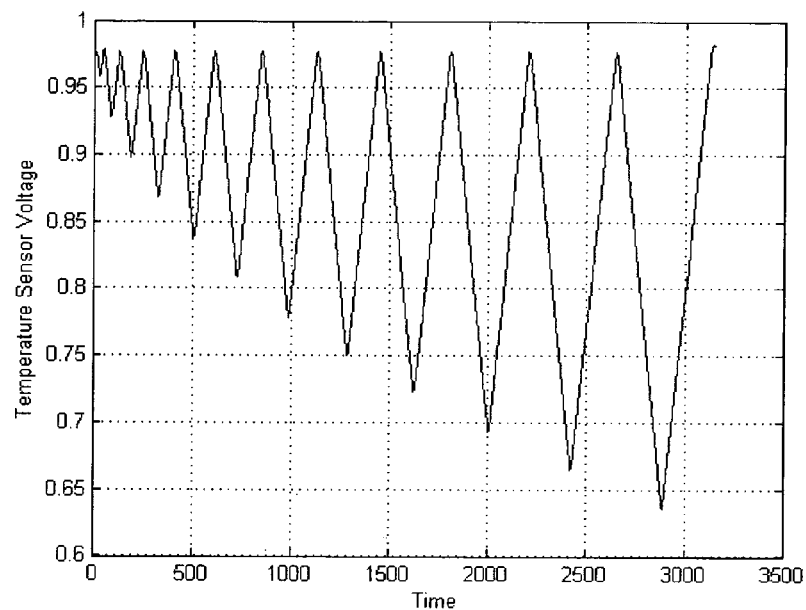
FIG. 8 is a diagram of a temperature profile which can be used in the second embodiment.

Following the same method as above, $F_1(u, f)$ can be found from the set of first order reversal curves giving the branches for increasing temperatures, such as shown in FIG. 8. This profile would yield a similar diagram to FIG. 7, but with the multiple branches corresponding to increasing temperatures instead of decreasing temperatures as required by equation 4. It may also be possible to adaptively learn both of the functions in the host application system with arbitrary/random temperature input.

An exact or approximate integral of the differential equations can then be evaluated to provide an estimate of the frequency error. One method to calculate the frequency error at a given temperature sensor value is using numerical integration of equation 4 starting from some initial value $f(u_0)=f_0$. If the sampling rate of the temperature sensor is sufficiently high, then each sample can be treated as a single step n in the integration, so that for example in a first order approximation, the output at $u_{n+1}$ is given by $$f(u_{n+1}) = \begin{cases} f(u_n) + (u_{n+1} - u_n) F_1(u_n, f_n), & \frac{du}{dt} > 0 \\ f(u_n) + (u_n - u_{n+1}) F_2(u_n, f_n), & \frac{du}{dt} < 0 \end{cases}$$

Alternatively the gap between each sample can be subdivided into smaller pieces, and/or higher order methods such as Runge-Kutta [2] could be employed—both of which may improve the solution accuracy.

In general, the first embodiment is preferred over the second embodiment because (in the forms presented) it requires less characterization data. An additional reason is that the assumption that each point of the hysteresis curve has a unique branch going through it for each direction of temperature is not always valid as can be seen in FIG. 2 at around 30° C. where some of the increasing curves intersect. In the literature this is referred to as 'local memory' [1], which is not assumed in the first embodiment.

Other Aspects of the Invention

Adaptive Refinement of Characterization Data

In applications where there is access to some information about the actual frequency reference error, the hysteresis characterization values or hysteresis model parameters can be adaptively refined. For example a GPS receiver can effectively measure the frequency error against an atomic clock when it is tracking satellites. This information can potentially be used in conjunction with the temperature sensor information to adaptively improve the accuracy of the hysteresis characterization data, to correct for differences between the manufacturer's test system and the host application, or to correct for relatively slow time dependent effects such as aging.

The training algorithm essentially adaptively implements the characterization algorithms previously discussed—for example in the first embodiment this can be done by finding the current values of α and β from the last turning point and the current temperature sensor voltage, and then calculating the output increment of the measured frequency from the descending section of the major loop at the current temperature and storing it in a table. The polynomial described in equation 2 is then periodically refitted with a combination of the old data and the new data which incrementally improves the accuracy and relevance of the characterization data.

It is also feasible for the hysteresis characterization values or parameters to be built-up entirely by the host application in such circumstances. This would typically require the host application system to build the characterization data in real-time, in response to natural ambient temperature fluctuations, or for the host application system to be subjected to a temperature profile such as the one given in FIG. 6. The first method comes at the expense of "out of the box" performance as it will take some time before accurate results are achieved and the second method may be costly and inefficient for the manufacturer of the host system. Because of the disadvantages stated above, the technique of adaptively learning the characterization values or parameters is best used in conjunction with data derived from measurements by the oscillator manufacturer as a starting point.

Figure 9:
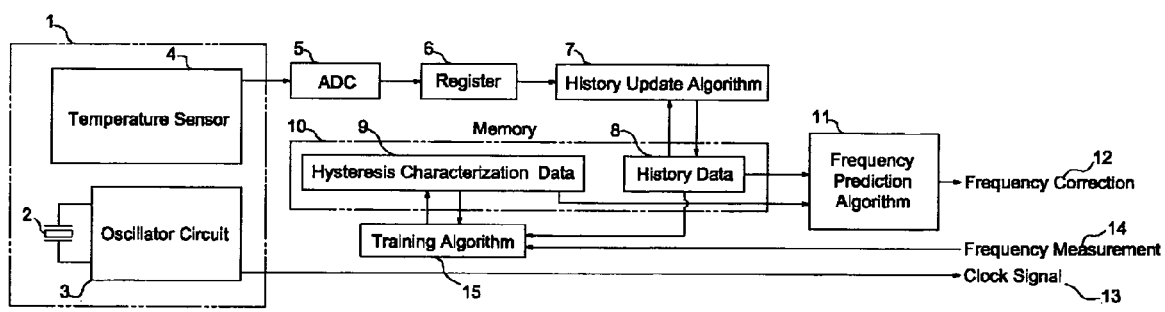
FIG. 9 is a functional block diagram of a further embodiment of the invention having adaptive refinement capabilities.

One method of incorporating adaptive refinement of the characterization parameters for the first embodiment is shown in FIG. 9. The main features of the diagram compared with FIG. 3 are the addition of frequency measurements 14 for example from a GPS receiver, and a training algorithm 15 which takes the frequency measurements, temperature history, and previous characterization data as an input and then updates the characterization data to more appropriately capture the new information.

Temperature Extrapolation

In some applications the time required to complete a measurement of the temperature, update the history table, make a frequency prediction, and finally apply the correction to a frequency synthesizer may be unacceptably long compared with the speed the temperature is changing at. In these cases extrapolation of the temperature may be necessary. This can be done by calculating the rate of change of temperature and using a first order linear extrapolation or by additionally calculating the acceleration and doing a second order approximation.

$$T(t + \Delta t) = T(t) + \frac{dT}{dt}\Delta t + \frac{1}{2}\frac{d^2 T}{dt^2}(\Delta t)^2 \quad (7)$$

The time lag Δt can be adaptively controlled if needed by comparing the predicted temperature with the actual temperature as new data becomes available.

Unique ID Code as a Link to Characterization Data

There may be insufficient memory space to store the frequency reference device's (FRD) hysteresis characterization data, particularly in miniature integrated FRDs intended for size- and cost-sensitive consumer applications such as mobile phones and GPS receivers. In accordance with the invention, the FRD may have a relatively small block of non-volatile memory wherein a unique (to each FRD sample) identification (ID) code is electronically stored. The full set of characterization parameters can be stored elsewhere outside the FRD, with the ID code being uniquely linked to characterization data pertaining to the specific FRD sample.

In such an arrangement, the ID code can be read out of the FRD, via a standard or a proprietary communications bus, by either the host application system or the manufacturing or maintenance plant equipment, followed by obtaining the full set of characterization parameters from a location outside the FRD, using the ID code as a unique identifier of characterization data pertaining the FDR. Such an arrangement reduces the requirements relating to the FRD's memory size considerably.

For example, storing the full set of FRD's characterization data may require sufficient memory for storing 31 parameters and (assuming 32-bit precision), consequently requiring 992 bits (124 bytes) of non-volatile memory space. In accordance with this aspect of the invention, only a unique ID code occupying for example 32 bits of memory is stored and is used as a link to the full set of FRD's hysteresis model parameters.

In a case when the FRD is a TCXO (Temperature Compensated Crystal Oscillator), the amount of memory required for storing the ID code can be further reduced by taking advantage of the fact that in integrated TCXOs the contents of programmable registers defining temperature compensation parameters can be made unique for any TCXO within a certain production batch.

For example, in a contemporary miniature TCXO utilizing a $5^{th}$ order compensation function generator, there are some 12 registers, ranging from 4 to 7 bits each, that are programmed during the TCXO manufacture to optimise the compensation function. Within a limited batch of TCXOs, for example in a batch of TCXOs produced within a single day, each TCXO either contains or can be made to contain a unique combination of binary values programmed in the registers that define temperature compensation parameters. An ID code uniquely identifying each of the TCXO devices can be made up by combining the contents of temperature compensation registers with registers storing a current date code. The latter can be feasibly stored in only as many as 13 bits of binary memory space.

ID Code Storage and Characterization Data Retrieval

As stated, utilizing the unique ID code allows the retrieval of the FRD's characterization data from locations outside of the FRD itself.

One possible implementation of such an arrangement is to provide the characterization data on a digital media (such as an optical disk, or a portable memory block, etc.) which is supplied by the FRD manufacturer with the FRD itself. The host application system manufacturing process may be arranged to read the characterization data from the said media (utilizing the FRD's ID code as a link to the pertinent data) and store the data in host application's memory space.

In another implementation, the characterization data is stored on the FRD manufacturer's server, or the host application manufacturer's server, or in both of these locations. In this case, the host application system itself, or the host application system's manufacturing or maintenance plant will access the server and retrieve the FRD characterization parameters data. Such server access can be done by advantageously utilizing network channels already available to devices such as mobile phones (e.g., CDMA or GSM cellular networks).

Application to Timekeeping

Figure 10:
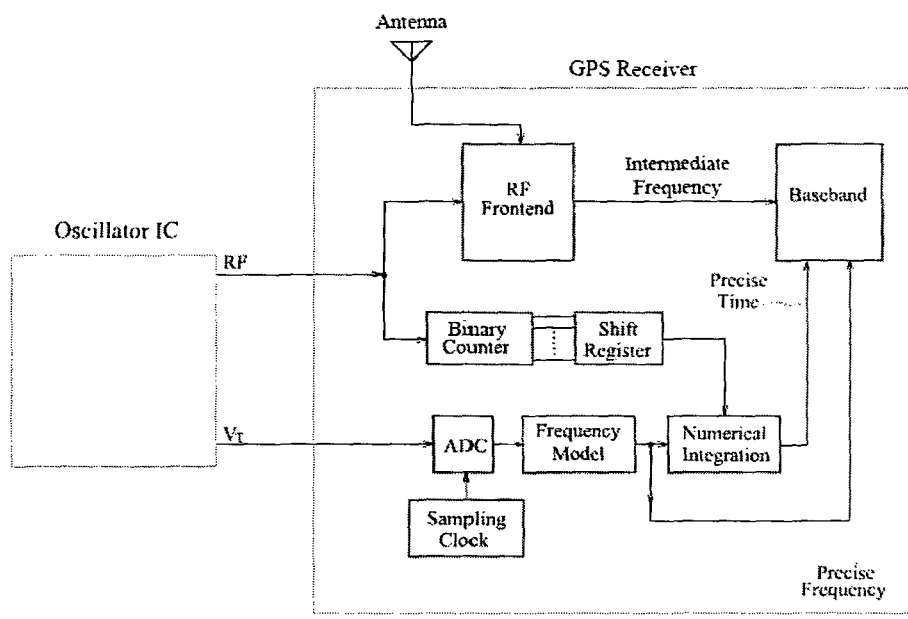
FIG. 10 is a functional block diagram of an application of the invention to improving timekeeping stability.

One application of the invention described herein is in improving time stability (i.e., time tracking accuracy). This can be useful in many applications requiring precise time—one such application being GPS receivers. FIG. 10 shows an example application of how to improve the time stability (tracking accuracy) with a model of frequency versus temperature hysteresis.

The figure shows that in addition to going into the GPS frontend for down-conversion as per usual, the RF output of the oscillator IC also goes into a binary counter which counts the number of pulses over time. Periodic temperature measurements are made by the ADC which are fed into a frequency model (in this case the hysteresis model), and the frequency readings are integrated against the binary counter readings to get the precise time, which is fed (along with the precise frequency) into the baseband to control the acquisition process by steering the NCO and constraining the search space.

Other Embodiments

The frequency reference device may be a quartz crystal oscillator, a temperature compensated quartz crystal oscillator or an oscillator utilizing a MEMS resonator. The host application may be a spread-spectrum radio receiver or a GPS receiver. The memory storing hysteresis characterization values or hysteresis model parameters may reside in the frequency reference source or in the host application system. Alternatively the values or parameters may be retrievable from memory accessible by either the host application system or the host application system manufacturing or maintenance plant. Alternative embodiments are possible which differ to those described above yet achieve similar results. For example, it is also possible to formulate the hysteresis models in different ways; also, some of the parts used in the embodiments may be replaced with other parts performing a similar function—for example, universal approximators such as fuzzy logic and neural networks. It should therefore be understood that the embodiments presented herein are merely illustrative and do not limit the scope of the invention which is defined in the accompanying claims.

REFERENCES

[1] Isaak D. Mayergoyz, "Mathematical Models of Hysteresis and their Applications," Amsterdam: Elsevier, 2003.

[2] Kendall E. Atkinson et al, "Numerical Solution of Ordinary Differential Equations," New Jersey: John Wiley and Sons, 2009

The invention claimed is:

1. A method of improving the frequency stability of a frequency reference, or improving the effective frequency stability of a frequency reference in a host application system, comprising:
   a) retrieving from memory data indicative of one or more temperature-frequency hysteresis characterization values or hysteresis model parameters,
   b) retrieving from memory data indicative of an accumulated hysteretic effect of the prior temperature history, and continually or periodically updating this data,
   c) executing an error calculation algorithm arranged to calculate an estimate of any reference frequency error using said hysteresis characterization values or said hysteresis model parameters, and said data of step (b), and
   d) using said estimate of frequency error to correct the reference frequency, or to mitigate the effect of reference frequency error in the host application system.

2. A method according to claim 1 wherein said temperature-frequency hysteresis characterization values or said hysteresis model parameters include values or parameters determined from temperature and frequency measurements obtained while subjecting the frequency reference, or a frequency reference with similar temperature-frequency hysteresis behavior to multiple temperature excursions of different magnitudes.

3. A method according to claim 2 wherein said temperature excursions form a temperature profile having any one or more of:
   temperature excursions of increasing or decreasing magnitudes or both,
   temperature change followed by a period of time where temperature is constant,
   or temperature changes of different or varying rates of change.

4. A method according to claim 1 wherein said temperature-frequency hysteresis characterization values or said hysteresis model parameters include values or parameters representative of a series of temperature-frequency hysteresis curves of the frequency reference, or of a frequency reference with similar temperature-frequency hysteresis behavior.

5. A method according to claim 1 wherein said temperature-frequency hysteresis characterization values or model parameters include coefficients of at least one two-dimensional polynomial or piecewise polynomial (spline) function and said error calculation algorithm includes at least one two-dimensional polynomial or piecewise polynomial (spline) function.

6. A method according to claim 1 wherein said temperature-frequency hysteresis characterization values or said hysteresis model parameters include parameters of a model utilizing fuzzy logic and said error calculation algorithm comprises a model utilizing fuzzy logic.

7. A method according to claim 1 wherein said temperature-frequency hysteresis characterization values or said hysteresis model parameters include parameters of a model utilizing a neural network and said error calculation algorithm includes a model utilizing a neural network.

8. A method according to claim 1 wherein said data indicative of the accumulated hysteretic effect includes one or more pairs of dominant maxima and minima from the temperature history experienced by the frequency reference.

9. A method according to claim 1 wherein executing the error calculation algorithm includes calculating an individual contribution of each pair of maxima and minima using a model relating to the temperature-frequency hysteresis characterization values of parameters of the frequency reference, and summing the individual contributions to obtain a full or partial estimate of the reference frequency error.

10. A method according to claim 1 wherein said executing the error calculation algorithm includes evaluating an exact or approximate integral of a differential equation which characterizes the hysteretic behavior of the frequency error.

11. A method according to claim 1 wherein said executing the error calculation algorithm includes evaluating a model which gives an estimate of any frequency error at the current temperature and last known hysteretic state.

12. A method according to claim 1 wherein said error calculation algorithm utilizes data representative of a most recent estimate of frequency error and said values or parameters representative of the series of temperature-frequency hysteresis curves of the frequency reference device.

13. A method according to claim 1 wherein the estimate of any reference frequency error is used to alter the frequency of the frequency reference in order to minimize any frequency error.

14. A method according to claim 1 wherein the estimate of any reference frequency error is provided to a frequency synthesizer in a host application system.

15. A method according to claim 1 wherein said frequency reference is a 30 quartz crystal oscillator.

16. A method according to claim 1 wherein said frequency reference is a temperature compensated quartz crystal oscillator.

17. A method according to claim 1 wherein said frequency reference is an oscillator utilizing a MEMS resonator.

18. A method according to claim 1 wherein said host application system is a spread-spectrum radio receiver.

19. A method according to claim 1 wherein said host application system is a GPS receiver.

20. A method according to claim 19 further comprising adaptively refining the temperature-frequency hysteresis characterization values or hysteresis model parameters of the frequency reference using temperature measurements and frequency offset data from at least one GPS satellite.

21. A frequency reference source, or a host application system utilizing a frequency reference source comprising:
   a) memory for storing data indicative of one or more temperature-frequency hysteresis characterization values or hysteresis model parameters,
   b) memory for storing continually or periodically updated data indicative of an accumulated hysteretic effect of the prior temperature history experienced by the frequency reference source,
   c) an integrated circuit for executing an error calculation algorithm arranged to calculate an estimate of any reference frequency error using said hysteresis characterization values or model parameters, data indicative of the accumulated hysteretic effect of temperature history, and wherein d) the frequency reference source and/or the host application system are arranged to use said estimate of frequency error to correct the reference frequency, or to mitigate the effect of any reference frequency error in the host application system.

22. A frequency reference source or host application system utilizing a frequency reference source according to claim 21 wherein said temperature-frequency hysteresis characterization values or said hysteresis model parameters are retrievable by means of utilizing an electronic identification code associated with the said frequency reference source.

23. A frequency reference source or host application system utilizing a frequency reference source according to claim 22 wherein temperature compensation parameters form part of the said electronic identification code.

* * * * *